(12) United States Patent
Mimura et al.

(10) Patent No.: US 8,575,689 B2
(45) Date of Patent: Nov. 5, 2013

(54) SILICON CARBIDE SEMICONDUCTOR DEVICE AND MANUFACTURING METHOD OF THE SAME

(75) Inventors: Tomohiro Mimura, Nisshin (JP);
Shinichiro Miyahara, Nisshin (JP);
Hidefumi Takaya, Toyota (JP);
Masahiro Sugimoto, Toyota (JP);
Narumasa Soejima, Seto (JP); Tsuyoshi Ishikawa, Nisshin (JP); Yukihiko Watanabe, Nagoya (JP)

(73) Assignees: DENSO CORPORATION, Kariya (JP);
Toyota Jidosha Kabushiki Kaisha, Toyota (JP)

( * ) Notice: Subject to any disclaimer, the term of this patent is extended or adjusted under 35 U.S.C. 154(b) by 34 days.

(21) Appl. No.: 13/330,835

(22) Filed: Dec. 20, 2011

(65) Prior Publication Data

US 2012/0161154 A1    Jun. 28, 2012

(30) Foreign Application Priority Data

Dec. 22, 2010    (JP) ................... 2010-286101

(51) Int. Cl.
| | |
|---|---|
| H01L 29/76 | (2006.01) |
| H01L 29/94 | (2006.01) |
| H01L 31/062 | (2012.01) |
| H01L 31/113 | (2006.01) |
| H01L 31/119 | (2006.01) |

(52) U.S. Cl.
USPC ............. 257/330; 257/328; 257/329; 257/77; 257/E29.262; 257/E21.41

(58) Field of Classification Search
None
See application file for complete search history.

(56) References Cited

U.S. PATENT DOCUMENTS

| | | | |
|---|---|---|---|
| 5,895,939 A | 4/1999 | Ueno | |
| 5,963,807 A | 10/1999 | Ueno | |
| 6,509,608 B1* | 1/2003 | Hueting | 257/330 |
| 2008/0230787 A1* | 9/2008 | Suzuki et al. | 257/77 |

FOREIGN PATENT DOCUMENTS

| | | |
|---|---|---|
| JP | A-2009-188221 | 8/2009 |
| JP | A-2009-289987 | 12/2009 |

* cited by examiner

*Primary Examiner* — Thien F Tran
(74) *Attorney, Agent, or Firm* — Posz Law Group, PLC

(57) ABSTRACT

An SiC semiconductor device includes a substrate, a drift layer, a base region, a source region, a trench, a gate oxide film, a gate electrode, a source electrode and a drain electrode. The substrate has a Si-face as a main surface. The source region has the Si-face. The trench is provided from a surface of the source region to a portion deeper than the base region and extends longitudinally in one direction and has a Si-face bottom. The trench has an inverse tapered shape, which has a smaller width at an entrance portion than at a bottom, at least at a portion that is in contact with the base region.

3 Claims, 6 Drawing Sheets

SILICON CARBIDE SEMICONDUCTOR DEVICE AND MANUFACTURING METHOD OF THE SAME

CROSS REFERENCE TO RELATED APPLICATION

This application is based on Japanese Patent Application No. 2010-286101 filed on Dec. 22, 2010, the disclosure of which is incorporated herein by reference.

TECHNICAL FIELD

The present invention relates to a silicon carbide (hereafter referred to as SiC) semiconductor device in which a semiconductor element having a trench gate structure is formed. The present invention also relates to a manufacturing method of the SiC semiconductor device.

BACKGROUND

As conventionally-known vertical semiconductor element that is made from an SiC substrate and has a trench gate structure, JP-A-2009-188221 and JP-A-2009-289987 disclose vertical metal-oxide semiconductor field-effect transistors (MOSFET). In the vertical MOSFETs disclosed in JP-A-2009-188221 and JP-A-2009-289987, in order to reduce on-state resistance in the vertical MOSFETs, a channel mobility is required to be increased. The channel mobility of SiC is dependent on a plane direction. Therefore, in the vertical MOSFET having the trench gate structure, a plane direction of a main surface of the SiC substrate and a plane direction of a sidewall of the trench are set in such a manner that the sidewall of the trench is set along a crystal plane in which the channel mobility is high. Specifically, a Si-face, which is a (0001) Si plane, or a C-face, which is a (000-1) C plane, is used as the main surface of the SiC substrate and an anisotropic etching is performed on the Si-face or the C-face to form the sidewall of the trench parallel to a (11-20) plane.

However, even if the Si-face or the C-face is used as the main surface of the SiC substrate and the anisotropic etching is performed to form the sidewall of the trench parallel to the (11-20) plane, the sidewall of the trench is formed to a tapered shape, which has a larger width at an entrance portion than at a bottom. Therefore, it is difficult to form the sidewall of the trench exactly parallel to the (11-20) plane. When the sidewall of the trench is not parallel to the (11-20) plane, the channel mobility will be decreased.

SUMMARY

In view of the foregoing difficulties, it is an object of the present disclosure to provide an SiC semiconductor device in which a high channel mobility, a broad process window and reliability of a gate oxide film are obtained when a trench gate structure is formed in the SiC semiconductor device. A second object is to provide a manufacturing method of the SiC semiconductor device.

According to a first aspect of the present disclosure, an SiC semiconductor device includes a substrate, a drift layer, a base region, a source region, a trench, a gate oxide film, a gate electrode, a source electrode and a drain electrode. The substrate is made of silicon carbide and has a Si-face as a main surface. The substrate has a first conductive type or a second conductive type. The drift layer is made of silicon carbide and is formed on the substrate. The drift layer has the first conductive type and has an impurity concentration that is lower than an impurity concentration of the substrate. The base region is made of silicon carbide and is formed on the drift layer. The base region has the second conductive type. The source region is made of silicon carbide and is formed in a surface portion of the base region. The source region has the Si-face, the first conductive type and an impurity concentration that is higher than the impurity concentration of the drift layer. The trench is provided from a surface of the source region to a portion deeper than the base region. The trench extends longitudinally in one direction and has a Si-face bottom. The trench has an inverse tapered shape, which has a smaller width at an entrance portion than at a bottom, at least at a portion that is in contact with the base region. The gate oxide film is formed on an inner wall of the trench. The gate electrode is formed on the gate oxide film in the trench. The source electrode is electrically coupled to the source region and the base region. The drain electrode is formed on a rear surface of the substrate. A channel region is formed in a surface portion of the base region, which is in contact with the trench, by controlling a voltage applied to the gate electrode, and current flows between the source electrode and the drain electrode through the source region and the drift layer.

In the above SiC semiconductor device, when a trench gate structure is formed in the SiC semiconductor device, the SiC semiconductor device can have a high channel mobility, a broad process window and reliability of a gate oxide film.

According to a second aspect of the present disclosure, a manufacturing method of the SiC semiconductor device includes preparing a substrate made of silicon carbide, epitaxially growing a drift layer made of silicon carbide on the substrate, forming a base region made of silicon carbide on the drift layer by an epitaxial growth or implanting ions into a surface portion of the drift layer, implanting first conductive type ions into a surface portion of the base region to form a source region made of silicon carbide, providing a trench from a surface portion of the source region to the drift layer through the base region by etching, oxidizing an inner wall of the trench to form a gate oxide film, forming a gate electrode on the gate oxide film in the trench, forming a source electrode electrically coupled to the source region and the base region and forming a drain electrode on a rear surface of the substrate. The substrate has a Si-face as a main surface and has a first conductive type or a second conductive type. The drift layer has the first conductive type and has an impurity concentration that is lower than an impurity concentration of the substrate. The base region has the second conductivity type. The source region has the first conductive type and has an impurity concentration that is higher than an impurity concentration of the drift layer. The trench extends longitudinally in one direction. The providing the trench includes providing the trench to have an inverse tapered shape, which has a smaller width at an entrance portion than at a bottom, at least at a portion that is in contact with the base region.

In the above manufacturing method of the SiC semiconductor device, when a trench gate structure is formed in the SiC semiconductor device, the SiC semiconductor device can have a high channel mobility, a broad process window and reliability of a gate oxide film.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Before describing embodiments of the present disclosure, a study performed by the inventors and results of the study will be described with reference to FIG. 6 and FIG. 7.

Figure 6:
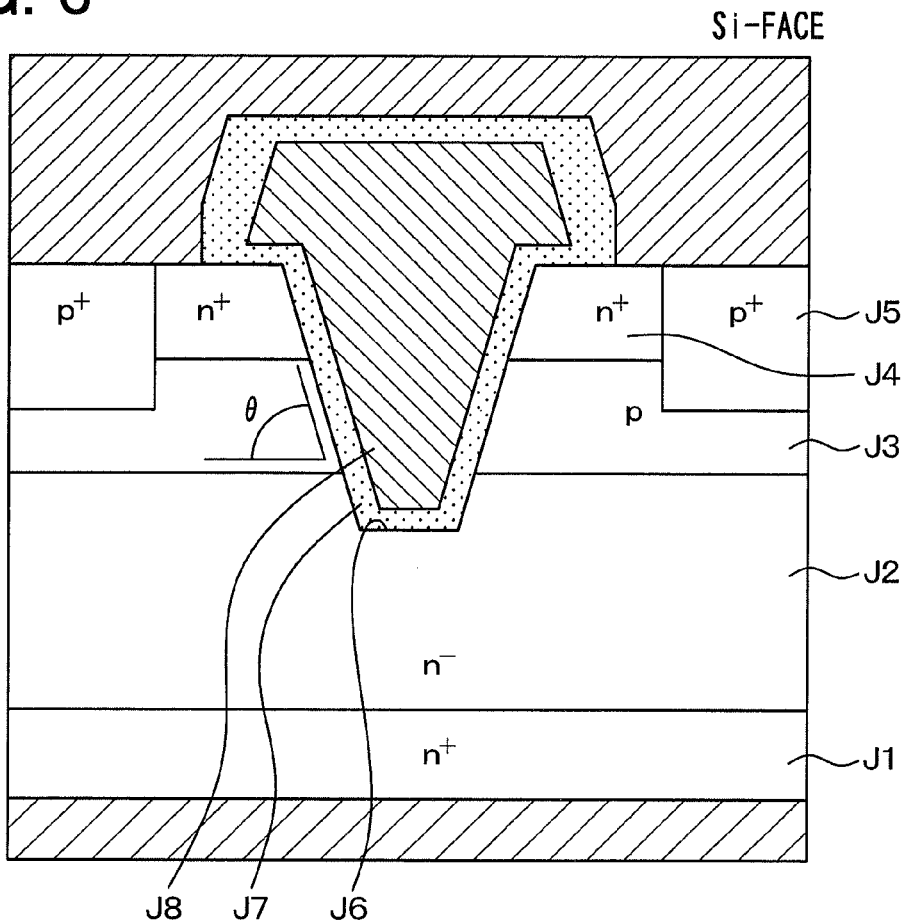
FIG. 6 is a cross-sectional view showing portions near a trench in a vertical MOSFET having a trench gate structure.
Figure 7:
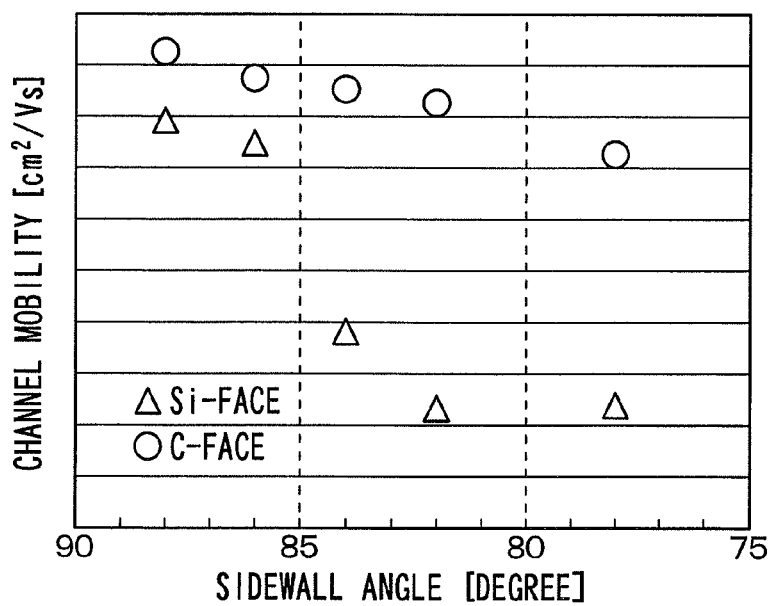
FIG. 7 is a graph showing a relationship between a sidewall angle θ and a channel mobility in a Si-face and a relationship between a sidewall angle θ and a channel mobility in a C-face.

As shown in FIG. 6, on an n$^+$-type substrate 31, an n$^-$-type drift layer J2, a p-type base region 33, an n$^+$-type source region J4 and a p$^+$-type contact layer J5 that is coupled to the p-type base region J3 are formed. A trench 36 penetrates the substrate from a surface of the substrate. Additionally, a gate oxide film 37 and a gate electrode 38 are formed in the trench 36. In the above-described structure, a sidewall angle θ of the trench J6 is defined as an angle between a horizontal direction of the substrate and a sidewall of the trench J6. As shown in FIG. 7, a channel mobility decreases with a decrease in the sidewall angle θ. Specifically, the channel mobility decreases significantly in a Si-face.

Thus, considering a process window during a formation of the trench 36, the n$^+$-type substrate 31 having a C-face as a main surface can restrict a reduction in the channel mobility more effectively compared with the n$^+$-type substrate J1 having a Si-face as the main surface. The process window is a process variation of the sidewall angle.

However, during a gate oxidation, an oxide film formed on the C-face has significant deterioration compared with an oxide film formed on the Si-face. In a case where the C-face is used as the main surface of the n$^+$-type substrate J1, when the gate oxide film J7 is formed by the gate oxidation, the gate oxide film 7 is formed on a bottom surface and an outside surface of the trench J6. Therefore, reliability of the gate oxide film J7 can not be obtained sufficiently.

First Embodiment

An SiC semiconductor device according to a first embodiment of the present disclosure will be described with reference to FIG. 1. The SiC semiconductor device includes a vertical MOSFET having a trench gate structure. In the present embodiment, a first conductivity type is set to n-type and a second conductivity type is set to p-type, as an example.

Figure 1:
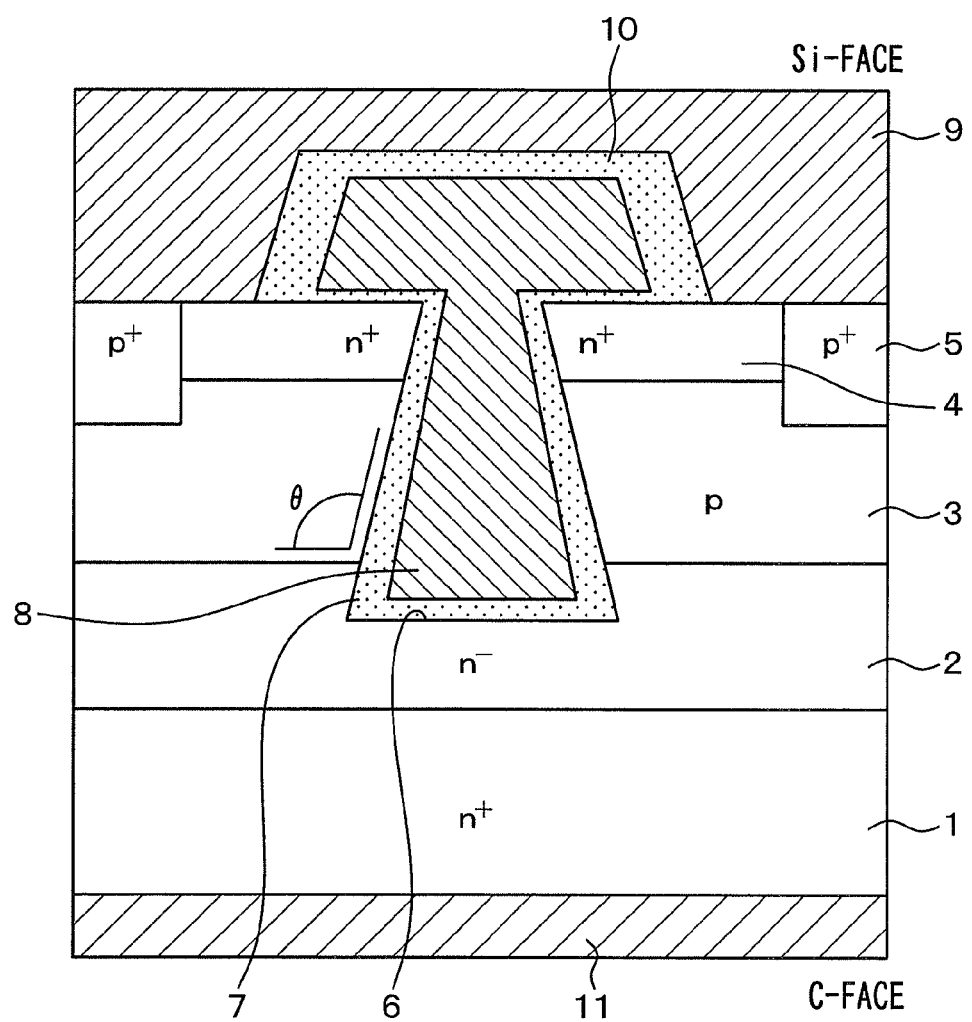
FIG. 1 is a cross-sectional view showing an SiC semiconductor device according to a first embodiment of the present disclosure.

As shown in FIG. 1, the vertical MOSFET is manufactured using an n$^+$-type substrate 1 made of SiC. The n$^+$-type substrate 1 has a Si-face, which is a (0001) Si plane, as a main surface. The n$^+$-type substrate 1 is doped with an n-type impurity, such as phosphorus, at a concentration of, for example, $1.0 \times 10^{19}/cm^3$, and has a thickness of approximately 300 μm. An n$^-$-type drift layer 2 made of SiC is formed on a surface of the n$^+$-type substrate 1. The n$^-$-type drift layer 2 is doped with an n-type impurity, such as phosphorus, at a concentration of, for example, $5.0 \times 10^{15}/cm^3$ to $2.0 \times 10^{16}/cm^3$, and has a thickness of approximately 8 μm to 15 μm. A p-type base region 3 is formed in a surface portion of the n$^-$-type drift layer 2. An n$^+$-type source region 4 and a p$^+$-type contact layer 5 are formed in a surface portion of the p-type base region 3.

The p-type base region 3 is doped with a p-type impurity, such as boron or aluminum, at a concentration of, for example, $5.0 \times 10^{16}/cm^3$ to $2.0 \times 10^{19}/cm^3$, and has a thickness of approximately 2.0 μm. A surface portion of the n$^+$-type source region 4 is doped with an n-type impurity, such as phosphorus, at a concentration (surface concentration) of, for example, $1.0 \times 10^{21}/cm^3$, and the n$^+$-type source region 4 has a thickness of approximately 0.3 μm. A surface portion of the p$^+$-type contact layer 5 is doped with a p-type impurity, such as boron or aluminum, at a concentration (surface concentration) of, for example, $1.0 \times 10^{21}/cm^3$, and the p$^+$-type contact layer 5 has a thickness of approximately 0.3 μm. The n$^+$-type source region 4 is disposed at each side of the trench gate structure, which will be described later. The p$^+$-type contact layer 5 is disposed on an opposite side of the n$^+$-type source region 4 from the trench gate structure.

The p-type base region 3 and the n$^+$-type source region 4 may be formed by performing epitaxial growth on the n$^-$-type drift layer 2 or by implanting ions into the surface portion of the n$^-$-type drift layer 2. In any case, the p-type base region 3 and the n$^+$-type source region 4 inherit the Si-face, which is the plane direction of the main surface of the n$^+$-type substrate 1, in a manner similar to the n$^-$-type drift layer 2, and surfaces of the p-type base region 3 and the n$^+$-type source region 4 are Si-faces.

A trench 6 penetrates the p-type base region 3 and the n$^+$-type source region 4 and reaches the n$^-$-type drift layer 2. The trench 6 has a width of, for example, 1.4 μm to 2.0 μm, and a depth of 2.0 μm or larger (for example, 2.4 μm). The p-type base region 3 and the n$^+$-type source region 4 are disposed in contact with a side portion of the trench 6.

The trench 6 has an inverse tapered shape, which has a smaller width at an entrance portion than at a bottom. In the present embodiment, a sidewall angle θ of the trench 6 is set within a range greater than 90 degrees and equal to or less than 102 degrees (90 degrees<θ≤102 degrees). In the trench 6, both a bottom surface and an outside surface are Si-faces, and a sidewall of the trench 6 has a certain offset angle from a (11-20) plane. The trench 6 is similar in a case where the trench 6 has the inverse tapered shape and is formed on the Si-face and in a case where the trench 6 has a tapered shape and is formed on a C-face. Therefore, as shown in FIG. 7, even when the sidewall angle θ of the trench 6 varies, a reduction of a channel mobility can be restricted. Specifically, when the sidewall angle θ of the trench 6 is set within a range greater than 90 degrees and equal to or less than 102 degrees, a plane direction of the sidewall of the trench 6 is the same with a plane direction of the sidewall in a case where the main surface is the C-face and the sidewall angle θ of the trench 6 is set within a range equal to or greater than 78 degrees and less than 90 degrees (78 degrees≤θ<90 degrees), and the channel mobility is similar to a channel mobility in a case where the main surface is the Si-face and the sidewall angle θ of the trench 6 is equal to or greater than 85 degrees (85 degrees≤θ). Accordingly, a high channel mobility can be obtained.

Further, an inner wall of the trench 6 is covered with a gate oxide film 7. A gate electrode 8 is formed on a surface of the gate oxide film 7, and the trench 6 is filled with the gate electrode 8. The gate electrode 8 is made of doped polycrystalline silicon (poly-Si). The gate oxide film 7 is formed by thermally oxidizing the inner wall of the trench 6, which is also known as gate oxidation. The gate oxide film 7 has a thickness of approximately 100 nm on both the inner wall and the bottom of the trench 6. As described above, because the bottom surface and the outside surface (surfaces of the $n^+$-type source region 4 and the $p^+$-type contact layer 5) of the trench 6 are Si-faces, the gate oxide film 7 has high reliability of restricting deterioration.

The trench gate structure is configured as described above. The trench gate structure extends longitudinally in a first direction that is parallel to the surface of the substrate 1. By arranging a plurality of gate structures in a second direction that is parallel to the surface of the substrate 1 and perpendicular to the first direction, a plurality of cells is formed.

Further, a source electrode 9 and gate wiring, which is not shown, are formed on the surfaces of the $n^+$-type source region 4, the $p^+$-type contact layer 5 and the gate electrode 8. The source electrode 9 and the gate wiring are made of a plurality of metals, such as Ni/Al. In the source electrode 9 and the gate wiring, at least a portion that is in contact with n-type SiC (specifically the $n^+$-type source region 4 and the gate electrode 8 when doped with an n-type impurity) is made of metals which enables ohmic contact with n-type SiC, and at least a portion that is in contact with p-type SiC (specifically the $p^+$-type contact layer 5 and the gate electrode 8 when doped with a p-type impurity) is made of metals which enables ohmic contact with p-type SiC. The source electrode 9 and the gate wiring are electrically insulated by an interlayer insulation film 10 on which the source electrode 9 and the gate wiring are formed. The source electrode 9 is electrically coupled with the $n^+$-type source region 4 and the $p^+$-type contact layer 5 via a contact hole defined by the interlayer insulation film 10, and the gate wiring is electrically coupled with the gate electrode 8 via another contact hole defined by the interlayer insulation film 10.

Additionally, a drain electrode 11 that is electrically coupled with the $n^+$-type substrate 1, is formed on a rear surface of the $n^+$-type substrate 1. The vertical MOSFET, which has a trench gate structure with an n-type inversion channel, has above-described configuration.

A manufacturing method of the SiC semiconductor device in which the vertical MOSFET having the trench gate structure is formed as shown in FIG. 1 will be described. The manufacturing processes will be described with reference to FIGS. 2A to 3B.

Figure 2A:
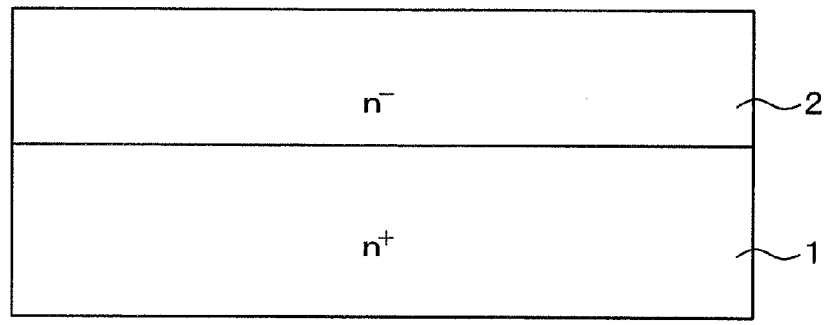
FIG. 2A to FIG. 2C are cross-sectional views showing manufacturing processes of the SiC semiconductor device shown in FIG. 1.

During a process shown in FIG. 2A, an $n^+$-type substrate 1 is prepared. A main surface of the $n^+$-type substrate 1 is the Si-face or has a predetermined offset angle from the Si-face. The $n^+$-type substrate 1 is doped with an n-type impurity, such as phosphorus, at a concentration of, for example, $1.0 \times 10^{19}/cm^3$, and has a thickness of approximately 300 μm. An $n^-$-type drift layer 2 made of SiC is epitaxially grown on a surface of the $n^+$-type substrate 1. The $n^-$-type drift layer 2 is doped with an n-type impurity, such as phosphorus, at a concentration of, for example, $3.0 \times 10^{15}/cm^3$ to $7.0 \times 10^{15}/cm^3$, and has a thickness of approximately 15 μm.

Figure 2B:
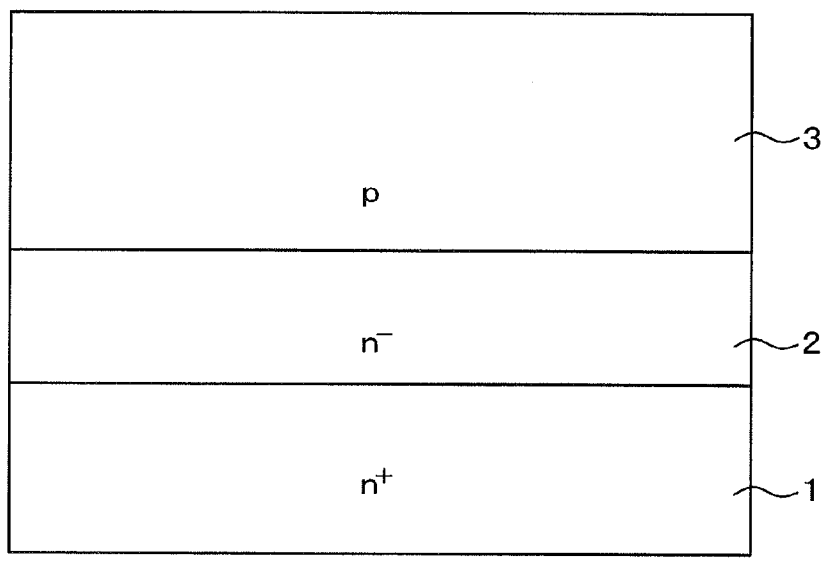

During a process shown in FIG. 2B, a p-type base region 3 is formed on a surface of the $n^-$-type drift layer 2 by epitaxially growing a p-type impurity layer, which is doped with a p-type impurity, such as boron or aluminum, at a concentration of, for example, $5.0 \times 10^{15}/cm^3$ to $5.0 \times 10^{16}/cm^3$ and has a thickness of approximately 2 μm.

Figure 2C:
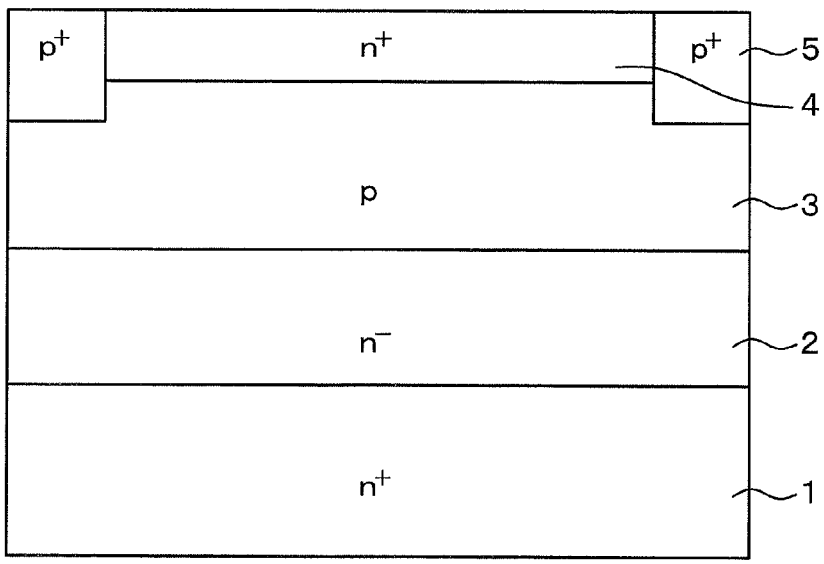

During a process shown in FIG. 2C, a mask (not shown), such as a low temperature oxide (LTO), is formed on the p-type base region 3. Then, photolithography is performed to remove a portion of the mask formed on a predetermined formation portion of an $n^+$-type source region 4. Then, an ion implantation of an n-type impurity, such as nitride, is performed. Then, the remained mask is removed and a new mask (not shown) is formed on the p-type base region 3. Then, photolithography is performed again to remove a portion of the new mask formed on a predetermined formation portion of a $p^+$-type contact layer 5. Next, an ion implantation of a p-type impurity, such as boron and aluminum, is performed.

Next, implanted n-type impurity ions are activated to form the $n^+$-type source region 4, which is doped with an n-type impurity, such as phosphorus, at a concentration (surface concentration) of, for example, $1.0 \times 10^{21}/cm^3$ and has a thickness of approximately 0.3 μm. At the same time, implanted p-type impurity ions are activated to form the $p^+$-type contact layer 5, which is doped with a p-type impurity, such as boron or aluminum, at a concentration (surface concentration) of, for example, $1.0 \times 10^{21}/cm^3$ and has a thickness of approximately 0.3 μm. Then, the remained mask is removed.

Figure 3A:
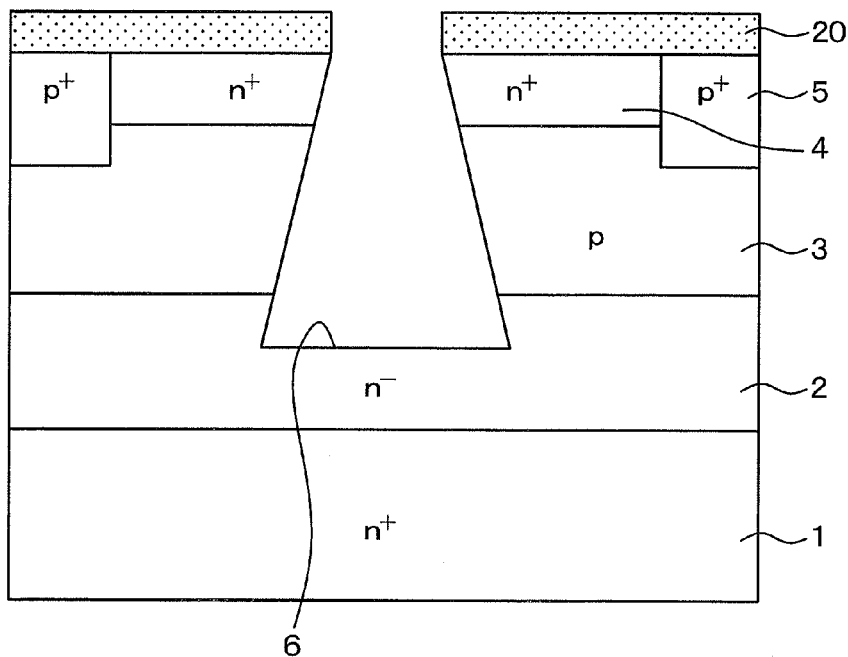
FIG. 3A to FIG. 3B are cross-sectional views showing manufacturing processes of the SIC semiconductor device shown in FIG. 1 following a manufacturing process shown in FIG. 2C.

During a process shown in FIG. 3A, an etching mask 20 is formed on the p-type base region 3, $n^+$-type source region 4 and the $p^+$-type contact layer 5. Then a portion of the etching mask 20 formed on a predetermined formation portion of a trench 6 is removed. Then an etching is performed anisotropically with the etching mask 20 covered on the p-type base region 3, $n^+$-type source region 4 and the $p^+$-type contact layer 5. For example, an inductive coupled plasma (ICP) etching may be performed anisotropically with an etching condition in which chemical reaction is enhanced. For example, the etching may be performed on conditions that a flow rate of $SF_6$ gas is within a range from 10 sccm to 20 sccm, a flow rate of $O_2$ gas is within a range from 0 sccm to 20 sccm, a flow rate of argon (Ar) gas is 20 sccm, an ICP power is within a range from 800 watts to 1000 watts, a bias power is within a range from 10 watts to 30 watts, and an atmosphere pressure is within a range from 0.7 Pa to 1.0 Pa. The $SF_6$ gas is fluorochemical etching gas and the argon gas is inert gas.

The trench 6 is provided by anisotropic etching under the above-described etching conditions. An etching time is controlled in such a manner that the trench 6 is formed to have an inverse tapered shape, which has a smaller width at an entrance portion than at a bottom, and have a sidewall angle θ within a range greater than 90 degrees and equal to or less than 102 degrees. Accordingly, the sidewall of the trench 6 is formed to have a certain offset angle from the (11-20) plane. However, the sidewall of the trench 6 can have a high channel mobility as shown in FIG. 7. Because, the etching condition is set to enhance the chemical reaction, horizontal etching is performed more easily than any other direction. Therefore, a formation of the inverse tapered shape can be accelerated. After the etching, a sacrificial oxidation is performed if necessary, and then the etching mask 20 is removed.

Figure 3B:
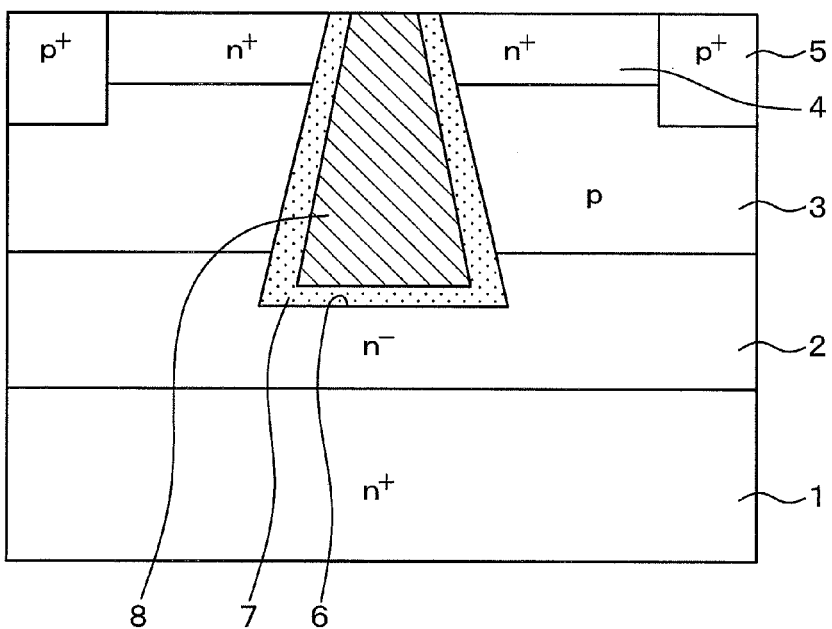

During a process shown in FIG. 3B, a gate oxide film 7 is formed on a surface of the $n^+$-type substrate 1 including an inner wall surface of the trench 6 by oxidizing (gate oxidation) a surface portion of the $n^+$-type substrate 1 including the inner wall of the trench 6. Specifically, a gate oxidation (thermal oxidation) is performed with a pyrogenic oxidation method under a wet atmosphere to form the gate oxide film 7. As described above, because the bottom surface and the outside surface (surfaces of the $n^+$-type source region 4 and the $p^+$-type contact layer 5) of the trench 6 are Si-faces, the gate oxide film 7 has high reliability of restricting deterioration.

Next, under a temperature of 600° C., a poly-Si layer doped with an n-type impurity is formed on a surface of the gate oxide film 7 to have a thickness of approximately 440 nm. Then etching back or the like is performed. Accordingly, the gate oxide film 7 and a gate electrode 8 are formed inside of the trench 6.

Next, processes are similar to the processes of a conventional art and are not shown by drawings. An interlayer insulation film 10 is formed. In the interlayer insulation film 10, a contact hole coupled with the n$^+$-type source region 4 and the p$^+$-type contact layer 5, and another contact hole coupled with the gate electrode 8 are defined respectively on two different cross-sections. Then, a source electrode 9 and gate wiring are formed by filling the two contact holes with an electrode material, and patterning the electrode material filled in two contact holes. Additionally, a drain electrode 11 is formed on a rear surface of the n$^+$-type substrate 1. By the above-described method, the MOSFET shown in FIG. 1 can be manufactured.

As described above, in the present embodiment, the n$^+$-type substrate 1 has the Si-face as the main surface and the trench 6 that forms the trench gate structure has the inverse tapered shape. Accordingly, the MOSFET described in the present embodiment is in similar state with a MOSFET in which the C-face is used as the main surface and the trench 6 has the tapered shape. Thus, when the sidewall angle θ of the trench 6 varies, a reduction of the channel mobility can be restricted. Therefore, a high channel mobility can be obtained. Additionally, because the bottom surface and the outside surface (surfaces of the n$^+$-type source region 4 and the p$^+$-type contact layer 5) of the trench 6 are Si-faces, the gate oxide film 7 has high reliability of restricting deterioration.

Thus, when a trench gate structure is formed in the SiC semiconductor device, the SiC semiconductor device can have a high channel mobility, a broad process window and reliability of a gate oxide film.

In the present embodiment, the sidewall angle θ of the trench 6 is set within a range greater than 90 degrees and equal to or less than 102 degrees. Thus, a plane direction of the sidewall of the trench 6 is the same with a plane direction of a sidewall in a case where the main surface is the C-face and the sidewall angle θ of the trench 6 is set within a range equal to or greater than 78 degrees and less than 90 degrees. Therefore, under a condition that the main surface is the Si-face, when the sidewall angle θ of the trench 6 is set within a range greater than 90 degrees and equal to or less than 102 degrees, the channel mobility is the same with a channel mobility when the sidewall angle θ of the trench 6 is equal to or greater than 85 degrees. Accordingly, a high channel mobility can be obtained.

Second Embodiment

An SiC semiconductor device according to a second embodiment of the present disclosure will be described. Because, in the present embodiment, a shape of the trench 6 is changed from the first embodiment and the other is similar to the first embodiment, only different part will be described.

Figure 4:
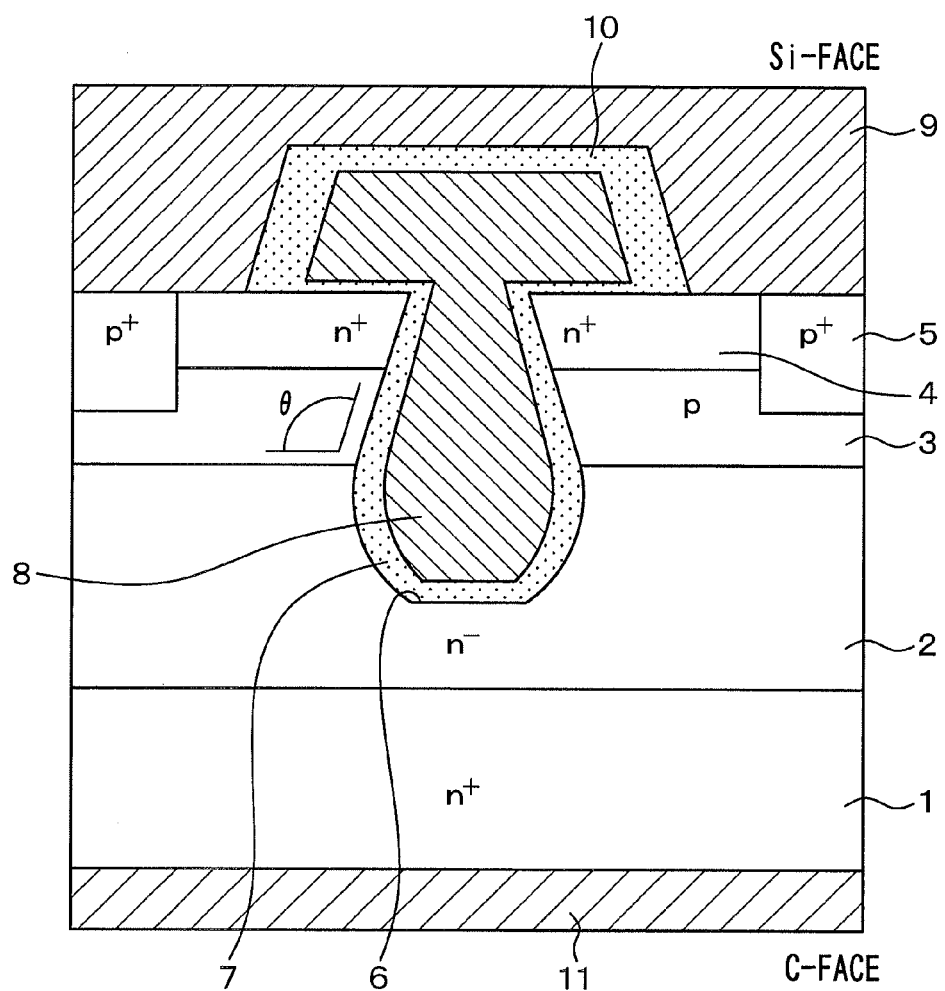
FIG. 4 is a cross-sectional view showing an SiC semiconductor device according to a second embodiment of the present disclosure.

As shown in FIG. 4, in the present embodiment, bottom corner portions of the trench 6 are rounded. The SiC semiconductor device according to the present embodiment can be basically manufactured with the manufacturing method described in the first embodiment. Rounding the bottom corner portions of the trench 6 can be performed in a manufacturing process shown in FIG. 3A by controlling etching conditions during formation of the trench 6, or by sacrificial oxidation and thermal treatment after the formation of the trench 6.

In the SiC semiconductor device according to the present embodiment, when a sidewall of the p-type base region 3, which forms a channel, has inverse tapered shape, the SiC semiconductor device according to the present embodiment provides similar advantages to the SiC semiconductor device according to the first embodiment. Further, when the sidewall of the p-type base region 3 has a sidewall angle θ within a range greater than 90 degrees and equal to or less than 102 degrees, a high channel mobility can be obtained.

Third Embodiment

An SiC semiconductor device according to a third embodiment of the present disclosure will be described. Because, in the present embodiment, a shape of the trench 6 is changed from the second embodiment and the other is similar to the second embodiment, only different part will be described.

Figure 5:
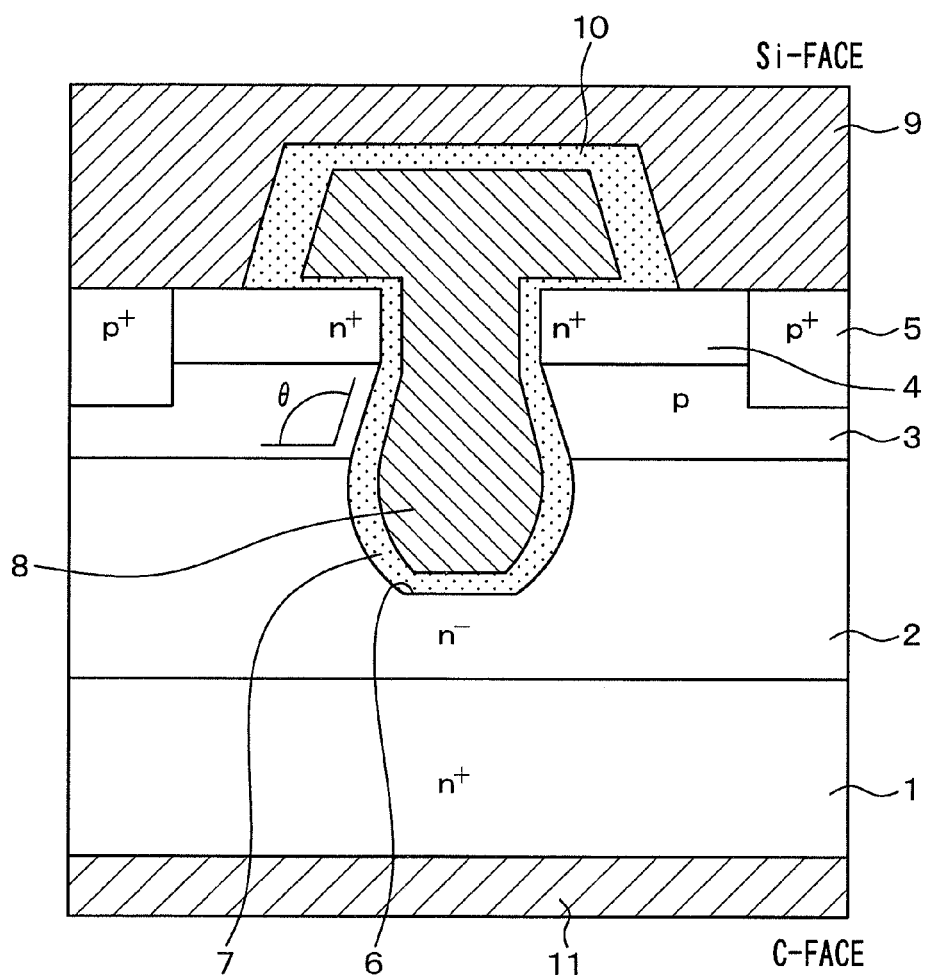
FIG. 5 is a cross-sectional view showing an SiC semiconductor device according to a third embodiment of the present disclosure.

As shown in FIG. 5, in the present embodiment, bottom corner portions of the trench 6 are rounded. Additionally, at an entrance portion of the trench 6, a sidewall of the trench 6 is perpendicular to a surface of the substrate. The trench 6 has a wider trench width at the entrance portion compared with a trench width of the SiC semiconductor device according to the second embodiment. The SiC semiconductor device according to the present embodiment can be basically manufactured with the manufacturing method described in the second embodiment. In the manufacturing process shown in FIG. 3A, similar to the Bosch process, etching is performed with the sidewall of the entrance portion in the trench 6 covered by a protection layer. The Bosch process is known as a deep reactive-ion etching (DRIE). Accordingly, the entrance portion of the trench has a wide opening.

In the SiC semiconductor device according to the present embodiment, when a sidewall of the p-type base region 3, which forms a channel, has inverse tapered shape, the SiC semiconductor device according to the present embodiment provides similar advantages to the SiC semiconductor device according to the second embodiment. Further, when the sidewall of the p-type base region 3 has a sidewall angle θ within a range greater than 90 degrees and equal to or less than 102 degrees, a high channel mobility can be obtained. Since the entrance portion of the trench 6 has the wide opening, the trench 6 is easily filled with doped poly-Si during formation of the gate electrode 8, and void defects generated during the trench filling can be restricted.

Other Embodiments

In each of the forgoing embodiments, during the formation of the trench 6, etching is performed anisotropically in a direction perpendicular to the surface of the substrate. At the same time, etching in a horizontal direction is performed to form the trench into the inverse tapered shape. Alternatively, the etching may be performed anisotropically in a direction along the sidewall of the trench 6 to form the trench 6 into the inverse tapered shape.

In each of the forgoing embodiments, an n-channel MOSFET in which the first conductive type is n-type and the second conductive type is p-type, is described as an example. Alternatively, the present disclosure may be applied to a p-channel MOSFET in which the first conductive type is p-type and the second conductive type is n-type. Additionally, in each of the forgoing embodiments, a MOSFET having the trench gate structure is described as an example. Alternatively, the present disclosure is applied to an insulated gate bipolar transistor (IGBT) having the trench gate structure. The IGBT having the trench gate structure described in the present disclosure and a manufacturing method of the IGBT are similar to the MOSFET and the manufacturing method of the MOSFET in the forgoing embodiments except for changing the conductive type of the substrate 1 from n-type to p-type.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A silicon carbide semiconductor device comprising:
a substrate made of silicon carbide and having a Si-face as a main surface, the substrate having a first conductive type or a second conductive type;
a drift layer made of silicon carbide and formed on the substrate, the drift layer having the first conductive type and having an impurity concentration that is lower than an impurity concentration of the substrate;
a base region made of silicon carbide and formed on the drift layer, the base region having the second conductive type;
a source region made of silicon carbide and formed in a surface portion of the base region, the source region having the Si-face, the source region having the first conductive type and having an impurity concentration that is higher than the impurity concentration of the drift layer;
a trench provided from a surface of the source region to a portion deeper than the base region, the trench extending longitudinally in one direction and having a Si-face bottom;
a gate oxide film formed on an inner wall of the trench;
a gate electrode formed on the gate oxide film in the trench;
a source electrode electrically coupled to the source region and the base region; and
a drain electrode formed on a rear surface of the substrate,
wherein a channel region is formed in a surface portion of the base region, which is in contact with the trench, by controlling a voltage applied to the gate electrode, and current flows between the source electrode and the drain electrode through the source region and the drift layer, and
wherein the trench has an inverse tapered shape, which has a smaller width at an entrance portion than at a bottom, at least at a portion that is in contact with the base region.

2. The silicon carbide semiconductor device according to claim 1,
wherein a sidewall angle is defined as an angle between a sidewall of the trench and the Si-face, and
wherein the sidewall angle is set within a range greater than 90 degrees and equal to or less than 102 degrees at least at the portion that is in contact with the base region.

3. The silicon carbide semiconductor device according to claim 1,
wherein a portion of the sidewall of the trench is perpendicular to a surface of the substrate at the entrance portion of the trench.

* * * * *